US012645156B2

(12) United States Patent
Zhu et al.

(10) Patent No.: US 12,645,156 B2
(45) Date of Patent: Jun. 2, 2026

(54) PHASE MEASUREMENT DEVICE FOR LASER INTERFERENCE PHOTOLITHOGRAPHY SYSTEM, AND METHOD FOR USING SAME

(71) Applicants: TSINGHUA UNIVERSITY, Beijing (CN); BEIJING U-PRECISION TECH CO., LTD., Beijing (CN)

(72) Inventors: Yu Zhu, Beijing (CN); Leijie Wang, Beijing (CN); Ming Zhang, Beijing (CN); Jitao Xu, Beijing (CN); Rong Cheng, Beijing (CN); Jiankun Hao, Beijing (CN); Xin Li, Beijing (CN); Kaiming Yang, Beijing (CN); Yujiao Fan, Beijing (CN); Siqi Gao, Beijing (CN)

(73) Assignees: TSINGHUA UNIVERSITY, Beijing (CN); BEIJING U-PRECISION TECH CO., LTD., Beijing (CN)

( * ) Notice: Subject to any disclaimer, the term of this patent is extended or adjusted under 35 U.S.C. 154(b) by 657 days.

(21) Appl. No.: 17/767,420

(22) PCT Filed: Oct. 23, 2020

(86) PCT No.: PCT/CN2020/123228
§ 371 (c)(1),
(2) Date: Feb. 15, 2024

(87) PCT Pub. No.: WO2021/083045
PCT Pub. Date: May 6, 2021

(65) Prior Publication Data
US 2024/0319619 A1 Sep. 26, 2024

(30) Foreign Application Priority Data
Oct. 31, 2019 (CN) .......................... 201911050187.5

(51) Int. Cl.
*G03F 7/00* (2006.01)
*G01J 9/02* (2006.01)
(Continued)

(52) U.S. Cl.
CPC .............. *G03F 7/7085* (2013.01); *G01J 9/02* (2013.01); *G02B 27/285* (2013.01);
(Continued)

(58) Field of Classification Search
CPC .... G01J 9/02; G03F 7/70408; G03F 7/70825; G03F 7/7085; G03F 7/70975
See application file for complete search history.

(56) References Cited

U.S. PATENT DOCUMENTS

| | | | |
|---|---|---|---|
| 4,765,741 A | 8/1988 | Detro et al. | |
| 5,543,914 A * | 8/1996 | Henshaw | ........... G01B 9/02003 356/487 |
| 6,137,574 A | 10/2000 | Hill | |
| 6,304,318 B1 * | 10/2001 | Matsumoto | ........... G03F 7/7045 355/53 |

(Continued)

FOREIGN PATENT DOCUMENTS

| | | |
|---|---|---|
| CN | 101413783 A | 4/2009 |
| CN | 103092002 A | 5/2013 |

(Continued)

*Primary Examiner* — Deoram Persaud
(74) *Attorney, Agent, or Firm* — HOLZER PATEL DRENNAN

(57) ABSTRACT

Disclosed is a phase measurement device, comprising: a first wave plate, a first polarization splitting prism, a fourth wave plate, a retroreflector, a third wave plate, a reflector, a second wave plate, a polarizer, a second polarization splitting prism, a third polarization splitting prism, a first photoelectric detector, a second photoelectric detector, and a base, wherein the first to third polarization splitting prisms and the first and second photoelectric detectors are fixed on the base; the first to fourth wave plates are respectively arranged around the periphery of the first polarization splitting prism; the polarizer is arranged on an emitting surface of the third polarization splitting prism; the retroreflector is arranged on
(Continued)

an outer side of the fourth wave plate; and the reflector is arranged on an outer side of the third wave plate. An interferometric signal is resolved to obtain a measurement light beam phase.

8 Claims, 2 Drawing Sheets

(51) Int. Cl.
   *G02B 5/18*      (2006.01)
   *G02B 27/28*    (2006.01)
(52) U.S. Cl.
   CPC ....... *G02B 27/286* (2013.01); *G03F 7/70408* (2013.01); *G03F 7/70825* (2013.01); *G03F 7/70975* (2013.01); *G02B 5/1857* (2013.01)

(56)                    References Cited

U.S. PATENT DOCUMENTS

| | | | |
|---|---|---|---|
| 12,270,645 B2 * | 4/2025 | Zhu | G01B 11/02 |
| 2009/0046263 A1 * | 2/2009 | Liu | G03F 7/70408 |
| | | | 430/394 |
| 2013/0010306 A1 * | 1/2013 | Coene | G03F 7/70633 |
| | | | 356/508 |
| 2019/0302693 A1 * | 10/2019 | Rothenberg | G02B 5/1861 |
| 2024/0264534 A1 * | 8/2024 | Wang | G03F 7/7085 |

FOREIGN PATENT DOCUMENTS

| | | |
|---|---|---|
| CN | 104729402 A | 6/2015 |
| CN | 106225667 A | 12/2016 |
| CN | 108168465 A | 6/2018 |
| CN | 110837213 A | 2/2020 |
| WO | 0135168 A1 | 5/2001 |

* cited by examiner

PHASE MEASUREMENT DEVICE FOR LASER INTERFERENCE PHOTOLITHOGRAPHY SYSTEM, AND METHOD FOR USING SAME

This application claims the priority and benefits of Chinese Patent Application No. 201911050187.5 filed on Oct. 31, 2019 with the China National Intellectual Property Administration, the whole contents of which are incorporated herein by reference.

TECHNICAL FIELD

The present disclosure relates to the technical field of optical instrumentation, and particularly, relates to a phase measurement device for a laser interference photolithography system, and a method of using same.

BACKGROUND ART

As a key component of major engineering systems such as large-scale astronomical telescopes, laser ignition systems for inertial confinement nuclear fusion, and photolithography systems, grating devices are required to be continuously improved in size, groove density, precision, etc. in recent years. Meanwhile, the applications of gratings are not limited to one-dimensional gratings, but also two-dimensional gratings, curved gratings and period-variable gratings. There are demands for manufacturing meter sized gratings with an precision of nanometers scale and thousands groove per millimeter (g/mm), and thus manufacturing large-scale gratings with high-precision and high groove density has become a problem to be solved in the art.

Conventional methods of grating manufacturing such as mechanical scratching, laser direct writing, and splicing have various technical disadvantages. Mechanical scratching has disadvantages of a low precision in large-area manufacturing, long production period, ghost lines occurring in manufactured gratings, etc. Laser direct writing has disadvantages of low precision in large-area manufacturing, long production period, etc. Splicing has disadvantages of low splicing precision, complex splicing process, high manufacturing cost, etc. Therefore, it is difficult to manufacture the above-mentioned gratings by traditional methods. Laser interference photolithography is an important technology that uses periodic patterns generated by interference of two or more laser beams to expose a photosensitive substrate so as to manufacture micro-nano array devices. Laser interference photolithography is mainly used to manufacture devices, such as cylindrical arrays, gratings, aperture arrays, dot arrays, micro lens arrays etc., with a critical dimension smaller than a sub-wavelength of the light beam source. These micro array devices are widely used in national defense, civilian industry, scientific research, and other fields. By laser interference photolithography, manufacturing large-area gratings with high groove density, high precision and short production period can be realized, and, laser interference photolithography has gradually become the mainstream of manufacturing technologies of large-area high-precision gratings. The main difficulty in the application of interference photolithography in the manufacture of large-area high-precision gratings is the research and development of interference photolithography systems. The pattern locking precision in an interference photolithography system is determined by an interference pattern phase locking system, in which the key module is a phase measurement device. For the research and development of high-precision interference photolithography system, many related companies and research institutions have carried out a series of research mainly focusing on high-precision interference photolithography systems, and many patents have disclosed research results of phase measurement devices.

Scholars from the University of Texas at Arlington proposed a widely used interference pattern phase locking system. The system uses light beams from two exposing beams and make them interfered and incident on the CCD (Charge-coupled Device) to form interference fringes, the CCD obtains a drift of the interference pattern on the substrate by monitoring the amount of movement of a interference fringe and inputs the drift as feedback to a controller, and the controller controls a piezoelectric ceramic drive mirror base to adjust the phase of the interference pattern, thereby realizing the locking of the interference pattern and finally obtaining a better exposure quality. A sensor uses the CCD to receive optical signals and perform photoelectric conversion, but it is difficult to achieve high-speed and high-precision phase modulation due to the limitation of resolution and frame rate of the CCD, thus the production requirements for high-precision grating graphics cannot be met.

Scholars from the MIT proposed a phase locking system based on homodyne phase measurement interferometer. An exposure light beam source forms an interference pattern at a substrate after passing through a spectral reflection light beam path. In order to prevent the interference pattern from drifting, the system extracts left and right exposing beams respectively by using the beam splitter near the base to form two interference signals with a phase difference of 180° therebetween, and the interference signals are subjected to photoelectric conversion and differential amplification to obtain voltage signals. The interference pattern is affected by external interference and thus generate a phase shift, resulting in a change of voltage signals. The voltage signals are used as feedback to control an EOM (Electro-optic Modulator) to adjust the phase of the interference pattern to keep the voltage stable, thereby realizing locking of the interference pattern. The locking system adopts a photodetector to conduct the photoelectric conversion, which uses a measurement signal of a two-channel homodyne phase measurement interferometer as a DC signal, and has poor anti-interference capacity, thus it is not easy to achieve high-precision measurement, and it is difficult to solve, subdivide and determine the phase, so it is not the optimal choice.

A scanning laser interference photolithography system is disclosed in the U.S. Pat. No. 6,882,477 B1 by the Massachusetts Institute of Technology, the photolithography system uses the interference of two collimated small-sized beams to form an interference pattern, exposes a substrate for step scanning motion, and realizes production of large-area gratings, the interference of the two collimated small-sized beams effectively eliminates a phase nonlinear error of the interference pattern. Meanwhile, in order to prevent an error caused by a phase drift of the interference pattern of the system relative to a moving substrate platform, the photolithography system adopts a pattern locking device based on heterodyne measurement, the device generates a frequency difference for heterodyne phase measurement by providing three acousto-optic modulators in the interference light beam path, sampling the interference beam by a beam sampler to be sent to a heterodyne phase meter for pattern phase detection, and the detected phase is fed back to a controller which controls the acousto-optic modulators to modulate the phase, and thus realize a pattern locking. The method of heterodyne measurement has the advantages of high speed and high precision in the pattern phase locking, but when the structure is used to produce period-variable gratings, the offset of exposing beam may separate the spot of the beams. Accordingly, it is impossible to realize real-time fringe control for the period-variable grating interference exposure system.

In summary, the phase measurement devices in the prior art have the following problems: it is difficult to achieve high-speed and high-precision phase modulation due to the limitation of resolution and frame rate of the CCD; the homodyne phase measurement interferometer has poor anti-interference capacity; the existing heterodyne interferometer cannot realize fringe control for the period-variable grating interference exposure system; that is, the phase measurement in the prior art has certain limitations, and thus cannot realize the phase measurement for period-variable interference exposure system, and the fringe control in a process of producing the period-variable grating.

SUMMARY

In order to solve the above problems, the present disclosure provides a phase measurement device for a laser interference photolithography system, including: a first wave plate, a first polarization splitting prism, a fourth wave plate, a retroreflector, a third wave plate, a reflector, a second wave plate, a polarizer, a second polarization splitting prism, a third polarization splitting prism, a first photoelectric detector, a second photoelectric detector, and a base, wherein the first polarization splitting prism, the second polarization splitting prism, and the third polarization splitting prism are fixed on the base, and an emitting surface of the first polarization splitting prism is adjacent to one incident surface of the third polarization splitting prism, wherein an emitting surface of the second polarization splitting prism is adjacent to another incident surface of the third polarization splitting prism, and wherein the first photoelectric detector and the second photoelectric detector are fixed on the base in a direction of an emitting surface of the third polarization splitting prism.

In an embodiment, the first wave plate is arranged on one incident surface of the first polarization splitting prism and a fast axis direction of the first wave plate is at an angle of 45° with respect to an edge of the first polarization splitting prism, and an edge of the first wave plate is aligned with an edge of the one incident surface of the first polarization splitting prism, wherein the retroreflector is arranged on another incident surface of the first polarization splitting prism and a sideline direction of the retroreflector is perpendicular to a bottom side of the first polarization splitting prism, wherein the fourth wave plate is disposed between the first polarization splitting prism and the retroreflector and a fast axis direction of the fourth wave plate is at an angle of 45° with respect to an edge of the first polarization splitting prism, wherein the third wave plate is arranged on an emitting surface of the first polarization splitting prism and a fast axis direction of the third wave plate is at an angle of 45° with respect to an edge of the first polarization splitting prism, and the third wave plate and first wave plate are coaxially disposed, wherein the reflector and the third wave plate are coaxially disposed on an outer surface of the third wave plate away from the first polarization splitting prism, wherein the second wave plate is arranged between the first polarization splitting prism and the third polarization splitting prism, and is located in an optical path after the reflection of the reflector, the transmission through the third wave plate and the reflection of the first polarization splitting prism, wherein an edge of the second wave plate is aligned with an edge of the emitting surface of the first polarization splitting prism, and wherein the polarizer is arranged on the emitting surface of the third polarization splitting prism and a polarization direction of the polarizer is at an angle of 45° with respect to the third polarization splitting prism.

In an embodiment, each of the first wave plate, the third wave plate, and the fourth wave plate is a quarter wave plate, and the second wave plate is a half wave plate.

In an embodiment, a reference light beam with a s-polarization state is incident on the first wave plate, and is transmitted to the one incident surface of the first polarization splitting prism: a light beam reflected from the first polarization splitting prism, with a s-polarization state, transmits through the fourth wave plate, reflected by the retroreflector and transmits through the fourth wave plate and is converted into a light beam with a p-polarization state, and then the light beam transmits through the first polarization splitting prism, the third polarization splitting prism and the polarizer to be a first reference light beam; a light beam transmitted through the first polarization splitting prism transmits through the third wave plate, reflected by the reflector and transmitted by the third wave plate and is converted into a light beam with a s-polarization state, and then the light beam is reflected by the first polarization splitting prism and transmits through the second wave plate and is converted into a light beam with a p-polarization state, and then the light beam transmits through the third polarization splitting prism and the polarizer to be a second reference light beam.

In an embodiment, a first measurement light beam with a s-polarization state is incident on an incident surface of the second polarization splitting prism and reflected by the second polarization splitting prism, reflected by the third polarization splitting prism and transmits through the polarizer, and the light beam interferes with the first reference light beam to be a first measurement signal which is received by the first photoelectric detector to output a first measurement signal; a second measurement light beam with a s-polarization state is incident on the incident surface of the second polarization splitting prism and reflected by the second polarization splitting prism, reflected by the third polarization splitting prism and transmits through the polarizer, and the light beam interferes with the second reference light beam to form a second measurement signal which is received by the second photoelectric detector to output a second measurement signal.

Preferably, phase measurement device further includes a housing coupled to the base, which encloses the first polarization splitting prism, the second polarization splitting prism and the third polarization splitting prism.

Preferably, an upper surface of the base is provided with grooves for mounting the first polarization splitting prism, the second polarization splitting prism and the third polarization splitting prism, and the first polarization splitting prism, the second polarization splitting prism and the third polarization splitting prism are fixed on the grooves of the base. Further, positions of the grooves for mounting the first polarization splitting prism, the second polarization splitting prism and the third polarization splitting prism on the base are determined according to a six-point positioning method.

Preferably, the first polarization splitting prism, the second polarization splitting prism and the third polarization splitting prism are respectively bonded to the base by quick-drying adhesive.

Preferably, the first wave plate, the fourth wave plate, the third wave plate, and the second wave plate are respectively bonded to the first polarization splitting prism through van der Waals force, and the polarizer and the third polarization splitting prism are bonded through van der Waals force.

Preferably, the retroreflector and the fourth wave plate are bonded by ultraviolet curing adhesive; the reflector and the third wave plate are bonded by ultraviolet curing adhesive.

The present disclosure also provides a method of using the above-mentioned phase measurement device for a laser interference photolithography system. A reference light beam with a frequency of 120 MHz and a s-polarization state is incident on the first wave plate, and is transmitted to the incident surface of the first polarization splitting prism, a light beam reflected from the first polarization splitting prism, with a s-polarization state, transmits through the fourth wave plate, reflected by the retroreflector and transmits through the fourth wave plate and is converted into a light beam with a p-polarization state, and then the light beam transmits through the first polarization splitting prism, the third polarization splitting prism and the polarizer to be a first reference light beam; a light beam transmitted through the first polarization splitting prism transmits through the third wave plate, reflected by the reflector and transmits through the third wave plate and is converted into a light beam with a s-polarization state, and then the light beam is reflected by the first polarization splitting prism and transmits through the second wave plate, and is converted into a light beam with a p-polarization state, and then the light beam transmits through the third polarization splitting prism and the polarizer to be a second reference light beam.

A first measurement light beam with a frequency of 100 MHz and a s-polarization state is incident on an incident surface of the second polarization splitting prism, and is reflected by the second polarization splitting prism, reflected by the third polarization splitting prism and transmit through the polarizer, and then the light beam interferes with the first reference light beam to be a first measurement signal which is received by the first photoelectric detector to output a first measurement signal; a second measurement light beam with a frequency of 100 MHz and a s-polarization state is incident on the incident surface of the second polarization splitting prism, and is reflected by the second polarization splitting prism, reflected by the third polarization splitting prism and transmit through the polarizer, and then the light beam interferes with the second reference light beam to be a second measurement signal which is received by the second photoelectric detector to output a second measurement signal; the output first measurement signal and second measurement signal are processed to obtain phases of the first measurement light beam and second measurement light beam.

The frequencies of the first measurement signal and the second measurement signal obtained by using the above-mentioned phase measurement device for a laser interference photolithography system and the method of using same are the same, for example, both the first and second measurement signals are interference signals with a frequency difference of 20 MHz, wherein when the laser interference photolithography exposure period changes, a distance between the first measurement light beam and the second measurement light beam changes and the light beams are shifted towards the center or edge of the polarization splitting prism, and the reference light beams are shifted towards the center or edge of the polarization splitting prism by the same distance to ensure that the output measurement signals are maintained in a line and the strength of the signals will not change accordingly, thereby completing real-time fringe control for the period-variable exposure in laser interference photolithography.

The present disclosure may adopt a heterodyne measurement method, where heterodyne measurement light beam (reference light beam) forms two interference signals having the same frequency difference with two measurement beams, respectively, and including the phase information of the two measurement beams and the phase information of the heterodyne light beam, the heterodyne phase is eliminated through displacement calculation and the phase data of the two measurement beams are obtained.

The phase measurement device of the present disclosure can be used in the period-variable grating interference exposure system. The phase measurement device adopts a scheme of fringe control based on heterodyne measurement principle, and realizes the fringe control for period-variable interference exposure system. The phase measurement device has the advantages of high-speed and high-precision measurement, simple optical path structure, and high laser light utilization, thus it is suitable to be used in a photolithography system for producing period-variable gratings. The device achieves high-speed and high-precision measurement, adopts a highly integrated structure, and has simple optical path structure, and high laser light utilization.

Figure 1:
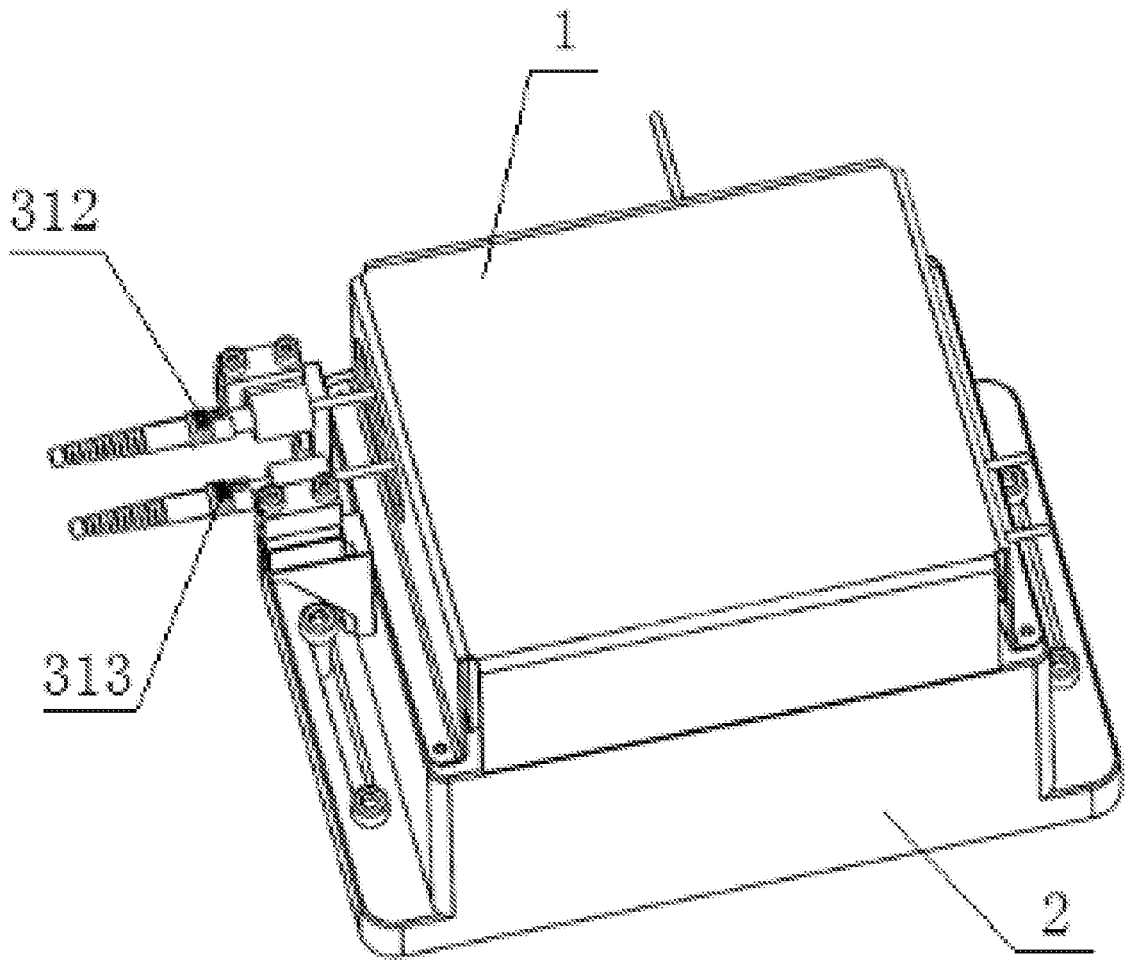
FIG. 1 is a perspective view of the phase measurement device for a laser interference photolithography system according to an embodiment of the present disclosure.

In the drawings: 1—housing; 2—base; 301—first polarization splitting prism; 302—first wave plate; 303—fourth wave plate; 304—retroreflector; 3-5—third wave plate; 306—reflector; 307—second wave plate; 308—second polarization splitting prism; 309—polarizer; 310—third polarization splitting prism; 312—first photoelectric detector; 313—second photoelectric detector; 314—reference light beam; 315—first measurement light beam; 316—second measurement light beam.

DETAILED DESCRIPTION OF THE EMBODIMENTS

In order to further illustrate the technical means adopted by the present disclosure to solve the technical problems and the technical effects achieved thereof, the present disclosure will be further described in detail below in conjunction with the accompanying drawings and specific embodiments. It should be noted that the drawings are schematic and are not drawn completely in accordance with size or scale, so the accompanying drawings and specific embodiments are not intended to limit the scope of the present disclosure.

As illustrated in FIG. 1, the phase measurement device for a laser interference photolithography system according to an embodiment of the present disclosure has a square box shape, in which the optical path system components are in the box formed by a housing 1 and a base 2. A first photoelectric detector 312 and a second photoelectric detector 313 protrude outside of the box. The housing 1 is fixedly connected with the base 2 by screw threads, and the first photoelectric detector 312 and the second photoelectric detector 313 can receive interference measurement signals split by a third polarization splitting prism 310 and polarized by a polarizer 309. That is, the first photoelectric detector 312 receives a first measurement signal and the second photoelectric detector 313 receives a second measurement signal, and the signals are then transmitted to a resolution system.

Figure 2:
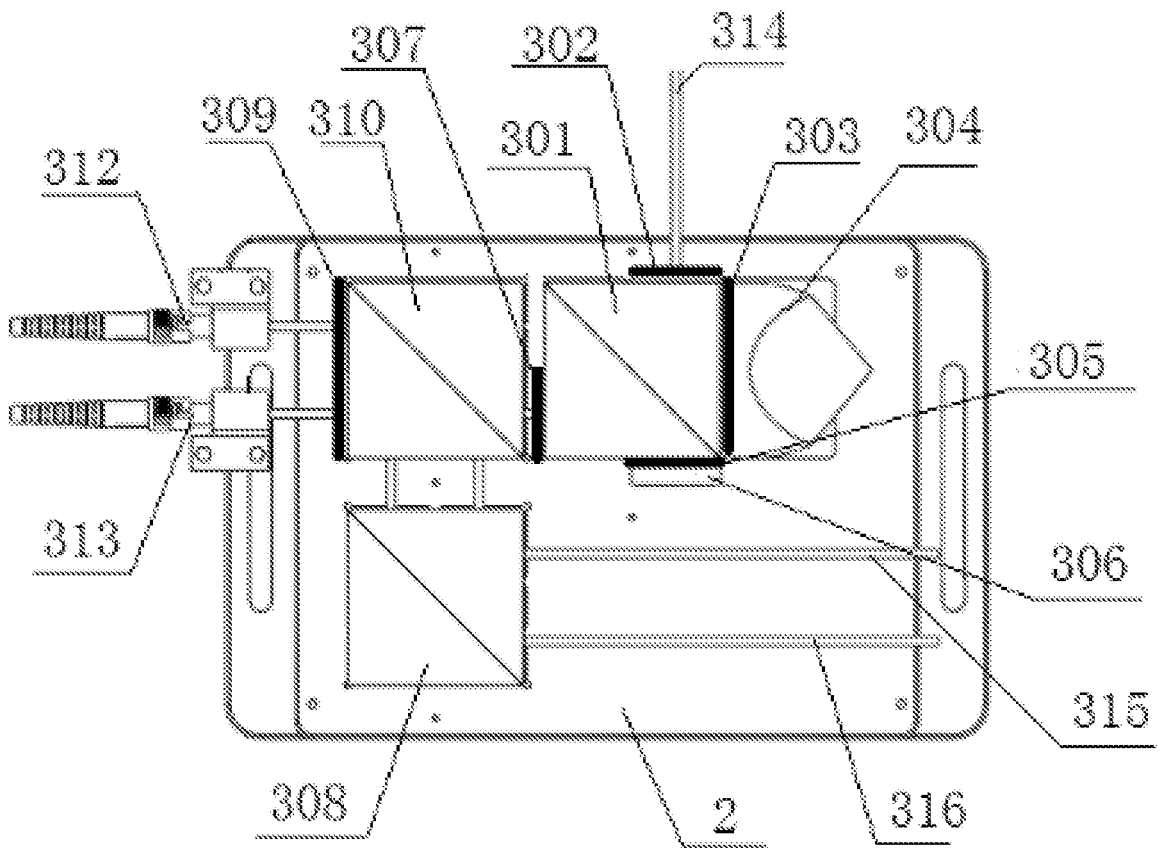
FIG. 2 is a schematic view of the phase measurement device of FIG. 1 from which the housing is removed.

The phase measurement device illustrated in FIG. 2 is phase measurement device illustrated in FIG. 1 from which the housing 1 is removed. The phase measurement device includes a first wave plate 302, a first polarization splitting prism 301, a fourth wave plate 303, a retroreflector 304, a third wave plate 305, a reflector 306, a second wave plate 307, a polarizer 309, a second polarization splitting prism 308, a third polarization splitting prism 310, a first photoelectric detector 312, a second photoelectric detector 313, and a base 2. The first polarization splitting prism 301, the second polarization splitting prism 308 and the third polarization splitting prism 310 are fixed on the base 2. An emitting surface of the first polarization splitting prism 301 is adjacent to an incident surface of the third polarization splitting prism 310, and an emitting surface of the second polarization splitting prism 308 is adjacent to another incident surface of the third polarization splitting prism 310. The first photoelectric detector 312 and the second photoelectric detector 313 are fixed on the base 2 in a direction of an emitting surface of the third polarization splitting prism 310;

The first wave plate 302 is arranged on an incident surface of the first polarization splitting prism 301 and a fast axis direction of the first wave plate 302 is at an angle of 45° with respect to an edge of the first polarization splitting prism 301, and an edge of the first wave plate 302 is aligned with an edge of the incident surface of the first polarization splitting prism 301. The retroreflector 304 is arranged on another incident surface of the first polarization splitting prism 301 and a sideline direction of the retroreflector 304 is perpendicular to a bottom side of the first polarization splitting prism 301. The fourth wave plate 303 is disposed between the first polarization splitting prism 301 and the retroreflector 304 and a fast axis direction of the fourth wave plate 303 is at an angle of 45° with respect to an edge of the first polarization splitting prism 301. The third wave plate 305 is arranged on an emitting surface of the first polarization splitting prism 301 and a fast axis direction of the third wave plate 305 is at an angle of 45° with respect to an edge of the first polarization splitting prism 301, and the third wave plate 305 and the first wave plate 302 are coaxially disposed. The reflector 306 and the third wave plate 305 are coaxially disposed on an outer surface of the third wave plate 305 away from the first polarization splitting prism 301. The second wave plate 307 is arranged between the first polarization splitting prism 301 and the third polarization splitting prism 310, and is located in an optical path after the reflection of the reflector 306, the transmission through the third wave plate 305 and the reflection of the first polarization splitting prism 301. An edge of the second wave plate 307 is aligned with an edge of the emitting surface of the first polarization splitting prism 301. The polarizer 309 is arranged on the emitting surface of the third polarization splitting prism 310 and a polarization direction of the polarizer 309 is at an angle of 45° with respect to the third polarization splitting prism 310. In the present embodiment, each of the first wave plate 302, the third wave plate 305, and the fourth wave plate 303 is a quarter wave plate, and the second wave plate 307 is a half wave plate. The first wave plate 302, the second wave plate 307, the third wave plate 305, and the fourth wave plate 303 are bonded to the first polarization splitting prism 301 through van der Waals force. The retroreflector 304 and the fourth wave plate 303 are bonded by ultraviolet curing adhesive. The reflector 306 and the third wave plate 305 are bonded by ultraviolet curing adhesive.

An upper surface of the base 2 may be provided with grooves for mounting the first polarization splitting prism 301, the second polarization splitting prism 308 and the third polarization splitting prism 310. The three grooves are positioned at vertices of a right-angled triangle, wherein the third polarization splitting prism 310 is located at the vertex of the right-angle. The positions of the grooves are determined according to a six-point positioning method to improve the positioning precision and ensure the high precision of the relative position of respective components. Then, the first polarization splitting prism 301, the second polarization splitting prism 308 and the third polarization splitting prism 310 are fixed in corresponding grooves, and bottom surfaces thereof are respectively bonded to the grooves of the base by quick-drying adhesive.

When the above-mentioned phase measurement device is used in a laser interference photolithography system, a reference light beam 314, for example, with a frequency of 120 MHz and a s-polarization state is incident on the first wave plate 302 and converted into a circular polarization state to incident on the first polarization splitting prism 301. On one aspect, a light beam reflected from the first polarization splitting prism 301, with a s-polarization state, transmits through the fourth wave plate 303, reflected by the retroreflector 304 and transmits through the fourth wave plate 303 and is converted into a light beam with a p-polarization state, and then the light beam transmits through the first polarization splitting prism 301, the third polarization splitting prism 310 and the polarizer 309 to be a first reference light beam. On another aspect, a light beam transmitted through the first polarization splitting prism 301 transmits through the third wave plate 305, reflected by the reflector 306 and transmits through the third wave plate 305 and is converted into a light beam with a s-polarization state, and then the light beam is reflected by the first polarization splitting prism 301 and transmits through the second wave plate 307, and is converted into a light beam with a p-polarization state, and then the light beam transmits through the third polarization splitting prism 310 and the polarizer 309 to be a second reference light beam.

The first measurement light beam 315 and the second measurement light beam 316 which are parallel to each other, for example, with a frequency of 100 MHz and a s-polarization state, are incident on the incident surface of the second polarization splitting prism 308, are reflected by the second polarization splitting prism 308, reflected by the third polarization splitting prism 310 and transmit through the polarizer 309, and the two light beams respectively interfere with the first reference light beam and the second reference light beam to be a first measurement signal and a second measurement signal. The two measurement signals are respectively received by the first photoelectric detector 312 and the second photoelectric detector 313, and the first photoelectric detector 312 and the second photoelectric detector 313 output electrical signals, from which the phases of the light beam to be measured are calculated. The two interferometric measurement signals have the same frequency and are interference signals, for example, with a frequency difference of 20 MHz. When the laser interference photolithography exposure period changes, a distance between the first measurement light beam 315 and the second measurement light beam 316 changes and the light beams are shifted towards the center or edge of the polarization splitting prism, and the reference light beams 314 are shifted towards the center or edge of the polarization splitting prism by the same distance to ensure that the output measurement signals are maintained in a line and the strength of the signals will not change accordingly, thereby completing real-time fringe control for the period-variable exposure in laser interference photolithography.

The above-mentioned fast axis direction refers to a vector direction of light beam that propagates fast in the wave plate. The van der Waals force refers to an intermolecular force.

The present disclosure may also have various other embodiments, and various corresponding changes and modifications can be made by those skilled in the art according to the present disclosure without departing from the spirit and essence of the present disclosure, but these corresponding changes and modifications should be within the scope of the claims of the present disclosure.

The invention claimed is:

1. A phase measurement device for a laser interference photolithography system, comprising:

a first wave plate, a first polarization splitting prism, a fourth wave plate, a retroreflector, a third wave plate, a reflector, a second wave plate, a polarizer, a second polarization splitting prism, a third polarization splitting prism, a first photoelectric detector, a second photoelectric detector, and a base, wherein the first polarization splitting prism, the second polarization splitting prism, and the third polarization splitting prism are fixed on the base, and an emitting surface of the first polarization splitting prism is adjacent to one incident surface of the third polarization splitting prism, wherein an emitting surface of the second polarization splitting prism is adjacent to another incident surface of the third polarization splitting prism, wherein the first photoelectric detector and the second photoelectric detector are fixed on the base in a direction of an emitting surface of the third polarization splitting prism, wherein the first wave plate is arranged on one incident surface of the first polarization splitting prism and a fast axis direction of the first wave plate is at an angle of 45° with respect to an edge of the first polarization splitting prism, and an edge of the first wave plate is aligned with an edge of the one incident surface of the first polarization splitting prism, wherein the retroreflector is arranged on another incident surface of the first polarization splitting prism with a sideline direction thereof perpendicular to a bottom side of the first polarization splitting prism, wherein the fourth wave plate is disposed between the first polarization splitting prism and the retroreflector and a fast axis direction of the fourth wave plate is at an angle of 45° with respect to an edge of the first polarization splitting prism, wherein the third wave plate is arranged on an emitting surface of the first polarization splitting prism and a fast axis direction of the third wave plate is at an angle of 45° with respect to an edge of the first polarization splitting prism, and the third wave plate and the first wave plate are coaxially disposed, wherein the reflector and the third wave plate are coaxially disposed on an outer surface of the third wave plate away from the first polarization splitting prism, wherein the second wave plate is arranged between the first polarization splitting prism and the third polarization splitting prism, and is located in an optical path after a reflection of the reflector, a transmission through the third wave plate and a reflection by the first polarization splitting prism, wherein an edge of the second wave plate is aligned with an edge of the emitting surface of the first polarization splitting prism, wherein the polarizer is arranged on the emitting surface of the third polarization splitting prism and a polarization direction of the polarizer is at an angle of 45° with respect to the third polarization splitting prism, wherein each of the first wave plate, the third wave plate, and the fourth wave plate is a quarter wave plate, and the second wave plate is a half wave plate, wherein the a reference light beam with a s-polarization state is incident on the first wave plate, and is transmitted to the one incident surface of the first polarization splitting prism: a light beam reflected from the first polarization splitting prism, with a s-polarization state, transmits through the fourth wave plate, reflected by the retroreflector and transmits through the fourth wave plate and is converted into a light beam with a p-polarization state, and then the light beam transmits through the first polarization splitting prism, the third polarization splitting prism and the polarizer to be a first reference light beam; a light beam transmitted through the first polarization splitting prism transmits through the third wave plate, reflected by the reflector and transmitted by the third wave plate and is converted into a light beam with a s-polarization state, and then the light beam is reflected by the first polarization splitting prism and transmits through the second wave plate and is converted into a light beam with a p-polarization state, and then the light beam transmits through the third polarization splitting prism and the polarizer to be a second reference light beam, and wherein a first measurement light beam with a s-polarization state is incident on an incident surface of the second polarization splitting prism and reflected by the second polarization splitting prism, reflected by the third polarization splitting prism and transmits through the polarizer, and the light beam interferes with the first reference light beam to be a first measurement signal which is received by the first photoelectric detector to output a first measurement signal; a second measurement light beam with a s-polarization state is incident on the incident surface of the second polarization splitting prism and reflected by the second polarization splitting prism, reflected by the third polarization splitting prism and transmits through the polarizer, and the light beam interferes with the second reference light beam to form a second measurement signal which is received by the second photoelectric detector to output a second measurement signal.

2. The phase measurement device for a laser interference photolithography system of claim 1, further comprising a housing coupled to the base, which encloses the first polarization splitting prism, the second polarization splitting prism and the third polarization splitting prism.

3. The phase measurement device for a laser interference photolithography system of claim 1, wherein an upper surface of the base is provided with grooves for mounting the first polarization splitting prism, the second polarization splitting prism and the third polarization splitting prism, and the first polarization splitting prism, the second polarization splitting prism and the third polarization splitting prism are fixed on the grooves of the base.

4. The phase measurement device for a laser interference photolithography system of claim 3, wherein positions of the grooves for mounting the first polarization splitting prism, the second polarization splitting prism and the third polarization splitting prism on the base are determined according to a six-point positioning method.

5. The phase measurement device for a laser interference photolithography system of claim 1, wherein the first polarization splitting prism, the second polarization splitting prism and the third polarization splitting prism are respectively bonded to the base by quick-drying adhesive.

6. The phase measurement device for a laser interference photolithography system of claim 1, wherein the first wave plate, the second wave plate, the third wave plate, and the fourth wave plate are respectively bonded to the first polarization splitting prism through van der Waals force, and the polarizer and the third polarization splitting prism are bonded through van der Waals force.

7. The phase measurement device for a laser interference photolithography system of claim 1, wherein the retroreflector and the fourth wave plate are bonded by ultraviolet curing adhesive; the reflector and the third wave plate are bonded by ultraviolet curing adhesive.

8. A method of using the phase measurement device for a laser interference photolithography system, wherein a reference light beam with a frequency of 120 MHz and a s-polarization state is incident on the first wave plate, and is transmitted to an incident surface of the first polarization splitting prism, a light beam reflected from the first polarization splitting prism, with a s-polarization state, transmits through the fourth wave plate, reflected by the retroreflector and transmits through the fourth wave plate and is converted into a light beam with a p-polarization state, and then the light beam transmits through the first polarization splitting prism, the third polarization splitting prism and the polarizer to be a first reference light beam; a light beam transmitted through the first polarization splitting prism transmits through the third wave plate, reflected by the reflector and transmits through the third wave plate and is converted into a light beam with a s-polarization state, and then the light beam is reflected by the first polarization splitting prism and transmits through the second wave plate, and is converted into a light beam with a p-polarization state, and then the light beam transmits through the third polarization splitting prism and the polarizer to be a second reference light beam, and wherein a first measurement light beam with a frequency of 100 MHz and a s-polarization state is incident on an incident surface of the second polarization splitting prism, and is reflected by the second polarization splitting prism, reflected by the third polarization splitting prism and transmit through the polarizer, and then the light beam interferes with the first reference light beam to be a first measurement signal which is received by the first photoelectric detector to output a first measurement signal; a second measurement light beam with a frequency of 100 MHz and a s-polarization state is incident on the incident surface of the second polarization splitting prism, and is reflected by the second polarization splitting prism, reflected by the third polarization splitting prism and transmit through the polarizer, and then the light beam interferes with the second reference light beam to be a second measurement signal which is received by the second photoelectric detector to output a second measurement signal; the output first measurement signal and second measurement signal are processed to obtain phases of the first measurement light beam and second measurement light beam.

\* \* \* \* \*